(12) United States Patent
Giles et al.

(10) Patent No.: US 7,838,373 B2
(45) Date of Patent: Nov. 23, 2010

(54) REPLACEMENT SPACERS FOR MOSFET FRINGE CAPACITANCE REDUCTION AND PROCESSES OF MAKING SAME

(75) Inventors: Martin Giles, Portland, OR (US); Titash Rakshit, Hillsboro, OR (US); Lucian Shifren, Hillsboro, OR (US); Jack Kavalieros, Portland, OR (US); Willy Rachmady, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 196 days.

(21) Appl. No.: 12/220,985

(22) Filed: Jul. 30, 2008

(65) Prior Publication Data

US 2010/0025775 A1  Feb. 4, 2010

(51) Int. Cl.
*H01L 21/336* (2006.01)
(52) U.S. Cl. .................. 438/303; 438/421; 438/595; 257/386; 257/E21.626; 257/E21.64

(58) Field of Classification Search ............... 438/221, 438/230, 303, 421, 424, 595, 696; 257/386, 257/900, E21.626, E21.64
See application file for complete search history.

(56) References Cited

U.S. PATENT DOCUMENTS 5,960,270 A * 9/1999 Misra et al. .................. 438/197
6,808,982 B2 * 10/2004 Parekh et al. ............... 438/253
7,132,342 B1 * 11/2006 Sadovnikov et al. ........ 438/303
7,585,716 B2 * 9/2009 Cheng .......................... 438/183

* cited by examiner

*Primary Examiner*—Ha Tran T Nguyen
*Assistant Examiner*—Daniel Whalen
(74) *Attorney, Agent, or Firm*—John N. Greaves

(57) ABSTRACT

A process includes planarizing a microelectronic device that includes a gate stack and adjacent trench contacts. The process also includes removing a gate spacer at the gate stack and replacing the gate spacer with a dielectric that results in a lowered overlap capacitance between the gate stack and an adjacent embedded trench contact.

21 Claims, 9 Drawing Sheets

REPLACEMENT SPACERS FOR MOSFET FRINGE CAPACITANCE REDUCTION AND PROCESSES OF MAKING SAME

TECHNICAL FIELD

Disclosed embodiments relate to semiconductor devices and processes of making them.

BRIEF DESCRIPTION OF THE DRAWINGS

In order to understand the manner in which embodiments are obtained, a more particular description of various embodiments briefly described above will be rendered by reference to the appended drawings. These drawings depict embodiments that are not necessarily drawn to scale and are not to be considered to be limiting in scope. Some embodiments will be described and explained with additional specificity and detail through the use of the accompanying drawings in which:

FIG. 1xy is a top plan of the microelectronic device depicted in FIG. 1a according to an embodiment;

FIG. 1xyz is a perspective cut-away elevation of the microelectronic device depicted in FIG. 1a according to an embodiment;

DETAILED DESCRIPTION

Reference will now be made to the drawings wherein like structures may be provided with like suffix reference designations. In order to show the structures of various embodiments of the disclosed inventions most clearly, the drawings included herein are diagrammatic representations of integrated circuit structures. Thus, the actual appearance of the fabricated structures, for example in a photomicrograph, may appear different while still incorporating the claimed structures of the illustrated embodiments. Moreover, the drawings show only the structures necessary to understand the illustrated embodiments. Additional structures known in the art have not been included to maintain the clarity of the drawings.

Figure 1:
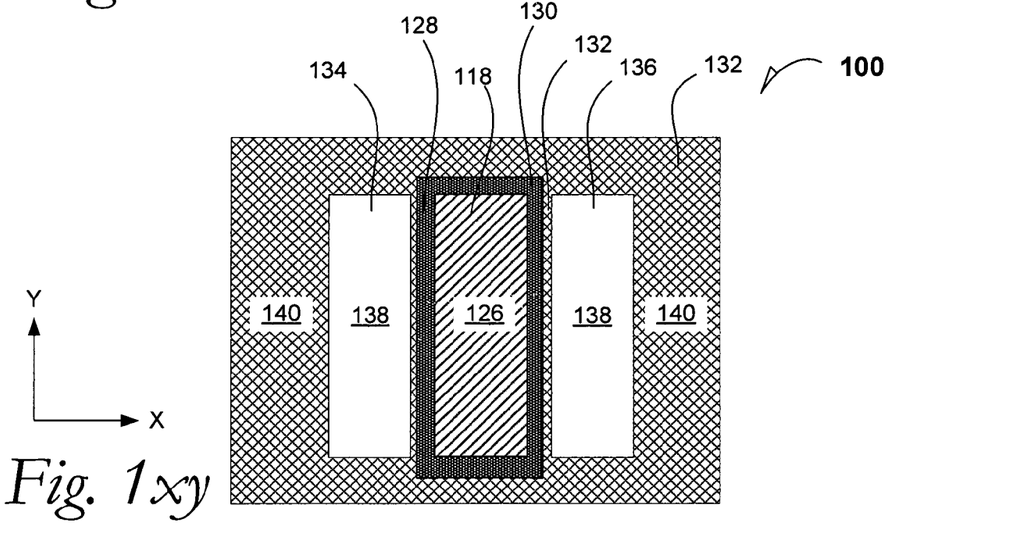
Figure 1A:
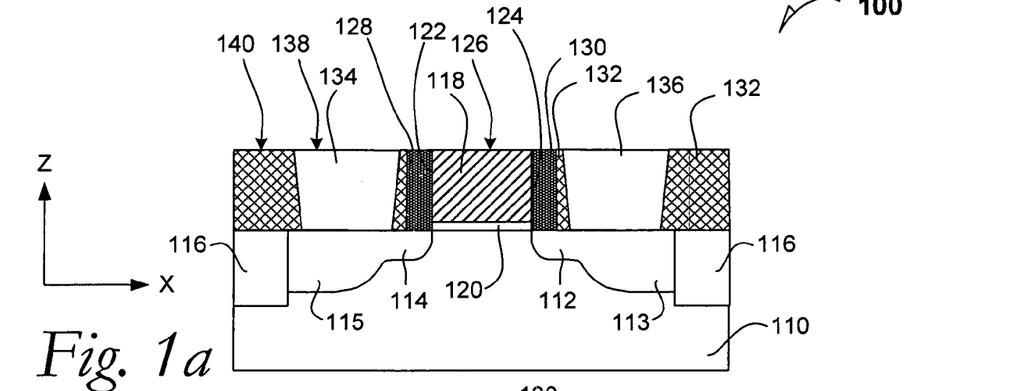
FIG. 1a is a cross-section elevation of a microelectronic device during processing according to an embodiment.

FIG. 1a is a cross-section elevation of a microelectronic device 100 during processing according to an embodiment. The microelectronic device 100 includes a semiconductive body 110 with source region doping 112, 113 and drain region doping 114, 115. The source region doping 112, 113 includes a shallow tip doping 112 and a deeper source doping 113, and the drain region doping 114, 115 also includes a shallow tip doping 114 and a deeper drain doping 115. The source doping 112, 113 and the drain doping 114, 115 are isolated in the semiconductive body 110 by a shallow trench isolation (STI) 116.

A gate stack is represented in simplified form with reference numeral 118, and the gate stack 118 is disposed above a gate dielectric 120. In an embodiment, the gate stack 118 is a metal gate stack 118. The gate stack 118 includes a first sidewall 122, a second sidewall 124, and a gate stack upper surface 126.

The microelectronic device 100 has been processed with a spacer etch to form a first spacer 128 and a second spacer 130 on the respective first sidewall 122 and second sidewall 124. An interlayer dielectric layer (ILD) 132 has been formed, and stacked trench contacts (TCNs) have been formed including a first TCN 134 and a second TCN 136. Formation of the first- and second TCNs 134 and 136, respectively, is done by etching recesses into the ILD 132, filling the recesses with TCN material, and polishing back the filled TCN material to expose the gate stack upper surface 126 as well as to form the TCN upper surface 138. FIG. 1a illustrates that the gate stack upper surface 126 and the TCN upper surface 138 are substantially co-planar. It can also be seen that the ILD 132 has a upper surface 140 that is substantially co-planar with the gate stack upper surface 126 and the TCN upper surface 138. The respective upper surfaces 126, 138, and 140 as well as those of spacers 128 and 130 are co-planar by employing a polishing process such as chemical-mechanical polishing (CMP), also referred to as chemical-mechanical planarization.

FIG. 1xy is a top plan of the semiconductive device 100 depicted in FIG. 1a according to an example embodiment. The gate stack 118 is depicted with the gate stack upper surface 126. The gate stack 118 is surrounded with a spacer that in this top plan includes the first spacer 128 and the second spacer 130 that appear as part of a ring structure around the gate stack 118. The first TCN 134 and the second TCN 136 are also depicted as being disposed in the ILD 132.

FIG. 1xyz is a perspective cut-away elevation of the microelectronic device depicted in FIG. 1a according to an embodiment with some portions of the materials removed for illustrative purposes. In this embodiment, the microelectronic device 100 is a fin-shaped field-effect transmitter (fin FET) where the semiconductive body 110 is a fin-shaped prominence that is surrounded by the STI 108, all supported by a semiconductor substrate (not shown).

The gate stack 118 is depicted with the gate stack upper surface 126. In this embodiment, the gate stack 118 wraps around the front of the semiconductive body 110 as well as around the back thereof, which front and back are depicted in the Y-dimension of the drawing. Consequently, the gate stack 118 contacts the semiconductive body 110 on three surfaces. In an embodiment, the gate stack 118 may contact only two surfaces of the semiconductive body 110 such as the top thereof and one of the front or back.

The gate stack 118 is surrounded with a spacer. As this perspective cut-away indicates, the spacer includes the first spacer 128 and the second spacer 130 previously indicated. The first TCN 134 and the second TCN 136 are also depicted as being disposed in the ILD 132. In a fin FET embodiment, an STI structure such as the STI 116 may not be present in the prominence portion of the semiconductive body 110, but one may be lodged in the semiconductor die.

It may now be understood that the semiconductive body 110 may be part of a planar, single-gate FET or a non-planar fin FET.

Figure 1B:
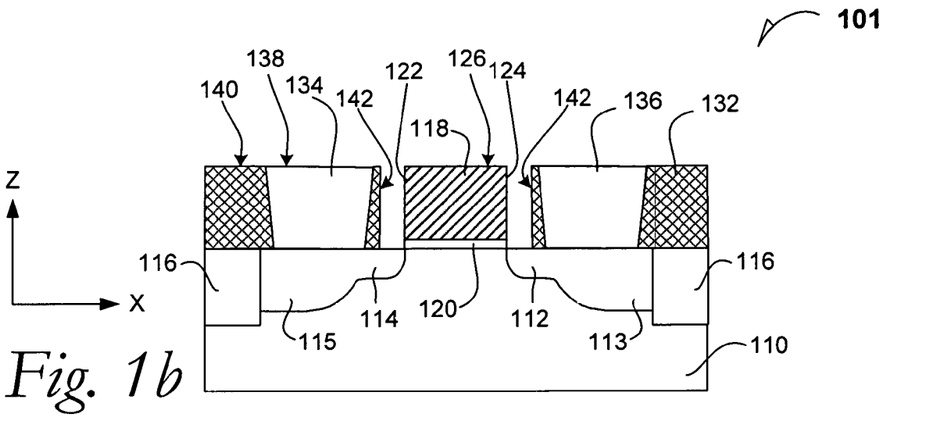
FIG. 1b is a cross-section elevation of the microelectronic device depicted in FIG. 1a after further processing according to an embodiment.

FIG. 1b is a cross-section elevation of the microelectronic device 100 depicted in FIG. 1a after further processing according to an embodiment. The microelectronic device 101 has been processed such that the first spacer 128 and the second spacer 130 (FIG. 1a) have been removed by an etch process to form a spacer void 142 that exposes the respective first sidewall 122 and second sidewall 124.

Figure 1C:
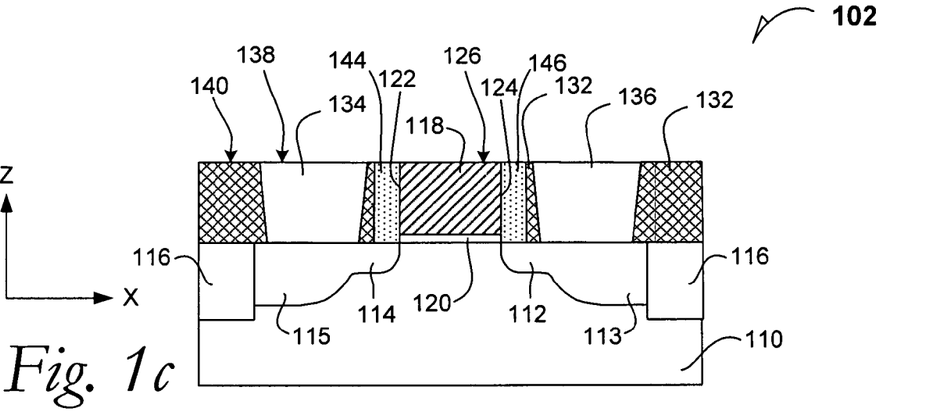
FIG. 1c is a cross-section elevation of the microelectronic device depicted in FIG. 1b after further processing according to an embodiment.

FIG. 1c is a cross-section elevation of the microelectronic device 101 depicted in FIG. 1b after further processing according to an embodiment. The microelectronic device 102 has been processed such that a replacement first spacer 144 and a replacement second spacer 146 have filled the spacer void 142 depicted in FIG. 1b. In this embodiment, the original first- and second spacers 128 and 130, respectively exhibited a first dielectric constant, and the replacement first- and second spacers 144 and 146 exhibit a second dielectric constant that is lower (lower-k) than that of the first dielectric constant. Consequently, the lower-k of the replacement first- and second spacers 144 and 146 is effective to reduce parasitic capacitance between the gate stack 118 and either or both of the first TCN 134 or the second TCN 136. The lower-k of the replacement first- and second spacers 144 and 146 is also effective to reduce the fringing capacitance between the gate stack 118 and the tip doping regions 114 and 112, respectively. Both of these capacitance components may be referred to as overlap capacitance (COV).

In this embodiment, the ILD 132 has remained such that a composite dielectric constant is exhibited that results in a unique COV that is contributed to by both the dielectric constant of the ILD 132 and the dielectric constant of one of the replacement first- and second spacers 144 and 146. In any event, the unique COV is less for the structure of the ILD 132 and one of the replacement first- and second spacers 144 and 146, than that of the ILD 132 and one of the first- and second spacers 128 and 130.

Figure 1D:
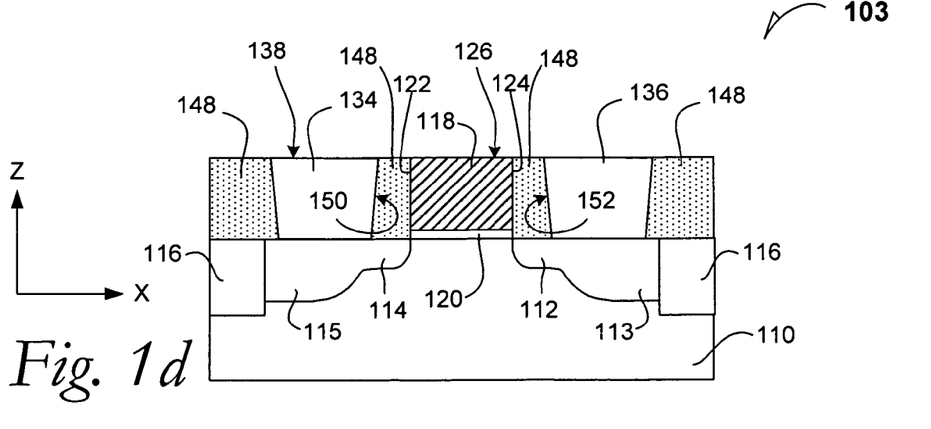
FIG. 1d is a cross-section elevation of the microelectronic device depicted in FIG. 1a after further processing according to an embodiment.

FIG. 1d is a cross-section elevation of the microelectronic device depicted in FIG. 1a after further processing according to an embodiment. An etch process or the like has been carried out to remove both the first- and second spacers 128 and 130 as well as the ILD 132. Thereafter, a fill process has been carried out such that a monolithic replacement spacer 148 has replaced both the ILD 132 and the first- and second spacers 128 and 130.

In this embodiment, the replacement spacer 148 exhibits a monolithic dielectric constant that results in a unique COV. In any event, the monolithic COV is less for the structure of the monolithic replacement spacer 148 than that of the ILD 132 and the first- and second spacers 128 and 130.

Also depicted is a first undercut 150 of the first TCN 134, a monolithic replacement spacer 144, at the first sidewall 122 of the gate stack 118. In this embodiment, the "monolithic replacement spacer" 144 means a single and uniform material that occupies the region between the first undercut 150 and the first sidewall 122. Similarly, the "monolithic replacement spacer" 144 means a single and uniform material that occupies the region between a second first undercut 152 and the second sidewall 124.

Figure 2A:
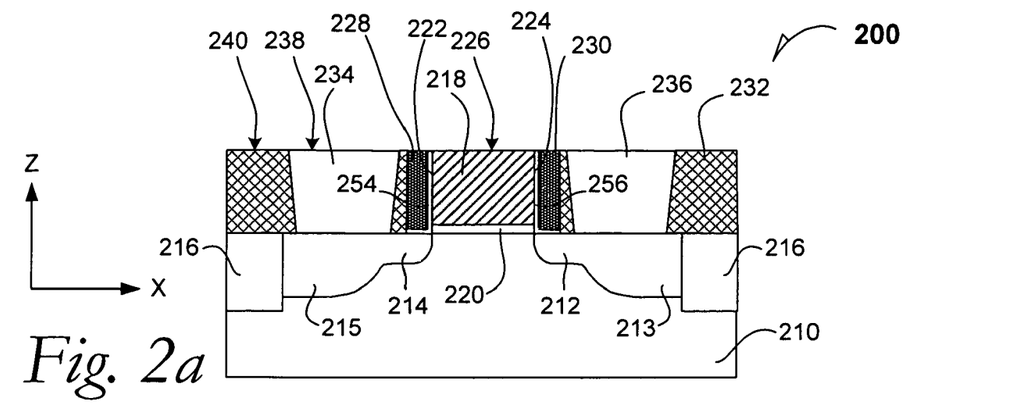
FIG. 2a is a cross-section elevation of a microelectronic device during processing according to an embodiment.

FIG. 2a is a cross-section elevation of a microelectronic device 200 during processing according to an embodiment. The microelectronic device 200 includes a semiconductive body 210 with a source doping region 212, 213 and a drain doping region 214, 215. The source doping region 212, 213 includes a shallow tip doping 212 and a deeper source doping 213, and the drain doping region 214, 215 also includes a shallow tip doping 214 and a deeper drain doping 215. The source region 212, 213 and the drain region 214, 215 are isolated in the semiconductive body 210 by an STI 216. In an embodiment, however, the semiconductive body 210 is a fin FET prominence such that the STI 216 may not be located as depicted. Rather, the STI may be lodged in a planar portion of the semiconductive substrate from which the semiconductive body 210 extends prominently.

A gate stack is represented in simplified form with reference numeral 218, and the gate stack 218 is disposed above a gate dielectric 220. In an embodiment, the gate stack 218 is a metal gate stack 218. The gate stack 218 includes a first sidewall 222, a second sidewall 224, and a gate stack upper surface 226. In this embodiment, the first sidewall 222 and second sidewall 224 are protected by respective permanent spacers 254 and 256.

The microelectronic device 200 has been processed with a spacer etch to form a first spacer 228 and a second spacer 230 on the respective permanent spacers 254 and 256. An ILD 232 has been formed, and TCNs have been formed including a first TCN 234 and a second TCN 236. Formation of the first- and second TCNs 234 and 236, respectively, is done by etching recesses into the ILD 232, filling the recesses with TCN material, and polishing back the filled TCN material to expose the gate stack upper surface 226 as well as to form the TCN upper surface 238. FIG. 2a illustrates that the gate stack upper surface 226 and the TCN upper surface 238 are substantially co-planar. It can also be seen that the ILD 232 has a upper surface 240 that is substantially co-planar with the gate stack upper surface 226 and the TCN upper surface 238. The respective upper surfaces 226, 238, and 240 as well as the tops of the spacers 228 and 230 are co-planar by employing an polishing process such CMP.

Figure 2B:
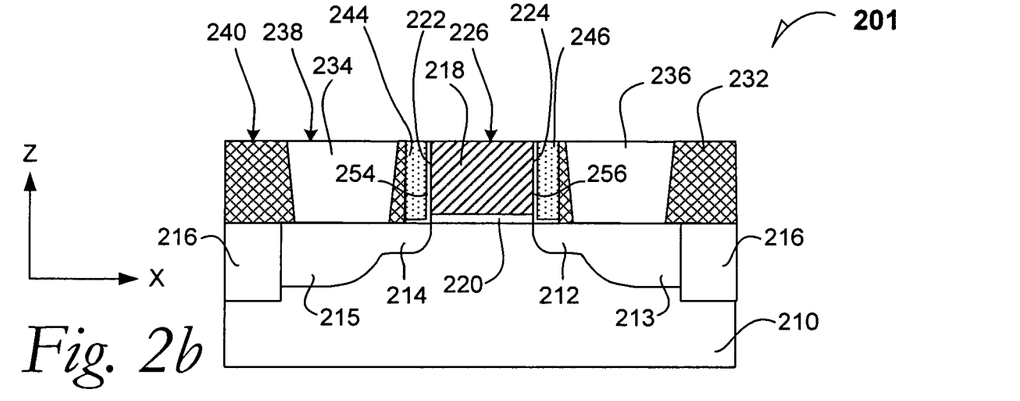
FIG. 2b is a cross-section elevation of the microelectronic device depicted in FIG. 2a after further processing according to an embodiment.

FIG. 2b is a cross-section elevation of the microelectronic device depicted in FIG. 2a after further processing according to an embodiment. The microelectronic device 201 has been processed such that the first spacer 228 and the second spacer 230 have been removed by an etch process to form a spacer void that exposes the permanent spacers 254 and 256, which remains adhered to the respective first sidewall 222 and second sidewall 224. The process has been continued to fill the spacer void with a replacement first spacer 244 and a replacement second spacer 246. In this embodiment, the original first- and second spacers 228 and 230, respectively exhibited a first dielectric constant, and the replacement first- and second spacers 244 and 246 exhibit a second dielectric constant that is lower than that of the first dielectric constant. Consequently, the lower-k of the replacement first- and second spacers 244 and 246 is effective to reduce parasitic capacitance between the gate stack 218 and either or both of the first TCN 234 or the second TCN 236. This leads to a lowering of COV.

In this embodiment, the ILD 232 and the permanent spacers 254 and 256 have remained such that a composite dielectric constant is exhibited that results in a unique COV that is contributed to by each of the dielectric constant of the ILD 232, the permanent spacers 254 and 256, and the dielectric constant of one of the replacement first- and second spacers 244 and 246. In any event, the unique COV is less for the structure of the of the ILD 232, the permanent spacers 254 and 256, and one of the replacement first- and second spacers 244 and 246, than that of the ILD 232, the permanent spacers 254 and 256, and the first- and second spacers 228 and 230.

Figure 2C:
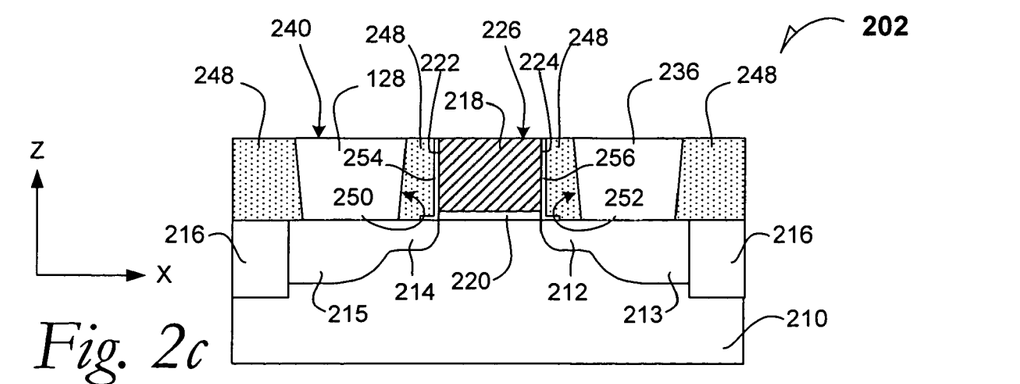
FIG. 2c is a cross-section elevation of the microelectronic device depicted in FIG. 2a after further processing according to an embodiment.

FIG. 2c is a cross-section elevation of the microelectronic device depicted in FIG. 2a after further processing according to an embodiment. An etch process or the like has been carried out to remove both the first- and second spacers 228 and 230 as well as the ILD 232, but not to remove the permanent spacers 254 and 256. Thereafter, a fill process has been carried out such that a monolithic replacement spacer 248 has replaced both the ILD 232 and the first- and second spacers 228 and 230.

In this embodiment, the replacement spacer 248 exhibits a composite dielectric constant that results in a unique COV. In any event, the composite COV is less for the structure of the composite replacement spacer 248 and the permanent spacers 254 and 256 than that of the ILD 232, the permanent spacers 254 and 256, the first- and second spacers 228 and 230.

Also depicted is a first undercut 250 of the first TCN 234 and a monolithic replacement spacer 248 that spans from the undercut 250 to the permanent spacer 254 as well as from the undercut 252 to the permanent spacer 256.

Figure 3A:
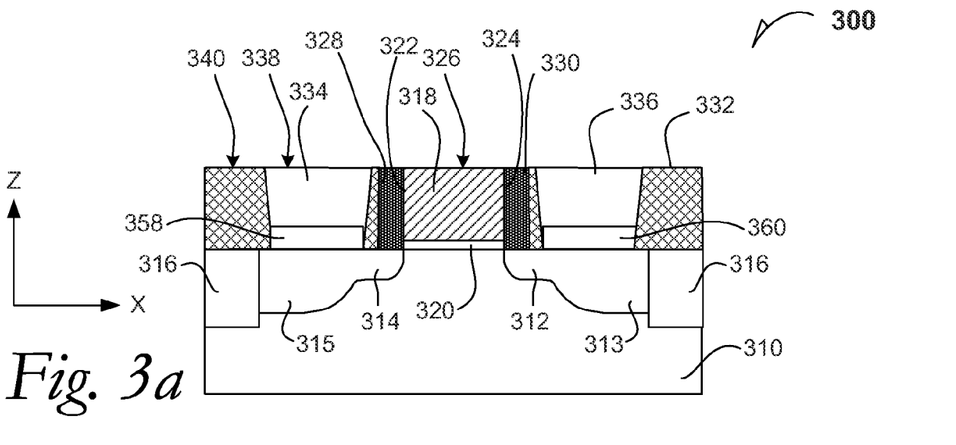
FIG. 3a is a cross-section elevation of a microelectronic device during processing according to an embodiment.

FIG. 3a is a cross-section elevation of a microelectronic device 300 during processing according to an embodiment. The microelectronic device 300 includes a semiconductive body 310 with a source doping region 312, 313 and a drain doping region 314, 315. The source doping 312, 313 and the drain doping 314, 315 are isolated in the semiconductive body 310 by an STI 316.

A gate stack is represented in simplified form with reference numeral 318, and the gate stack 318 is disposed above a gate dielectric 320. In an embodiment, the gate stack 318 is a metal gate stack 318. The gate stack 318 includes a first sidewall 322, a second sidewall 324, and a gate stack upper surface 326.

The microelectronic device 300 also has an epitaxial first layer 358 and an epitaxial second layer 360 that are disposed above the respective source region 312, 313 and drain region 314, 315. The microelectronic device 300 has been processed with a spacer etch to form a first spacer 328 and a second spacer 330 on the respective first sidewall 322 and second sidewall 324. An ILD 332 has been formed, and TCNs have been formed including a first TCN 334 and a second TCN 336. Formation of the first- and second TCNs 334 and 336, respectively, is done by etching recesses into the ILD 332, filling the recesses with TCN material, and polishing back the filled TCN material to expose the gate stack upper surface 326 as well as to form the TCN upper surface 338. FIG. 3a illustrates that the gate stack upper surface 326 and the TCN upper surface 338 are substantially co-planar. It can also be seen that the ILD 332 has a upper surface 340 that is substantially co-planar with the gate stack upper surface 326 and the TCN upper surface 338. The respective upper surfaces 326, 338, and 340 as well as the upper surfaces of the spacers 328 and 330 are co-planar by employing an polishing process such as CMP.

Figure 3B:
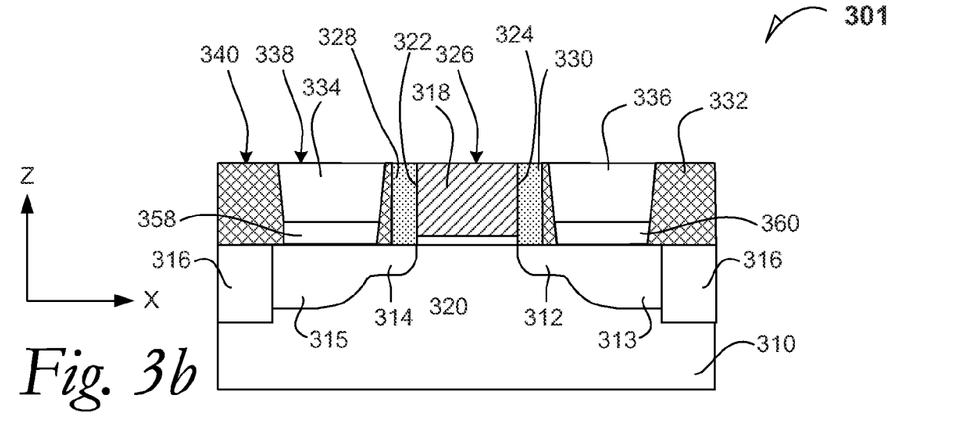
FIG. 3b is a cross-section elevation of the microelectronic device depicted in FIG. 3a after further processing according to an embodiment.

FIG. 3b is a cross-section elevation of the microelectronic device depicted in FIG. 3a after further processing according to an embodiment. The microelectronic device 301 has been processed such that the first spacer 328 and the second spacer 330 have been removed by an etch process to form a spacer void that exposes the respective first sidewall 322 and second sidewall 324. The process has been continued to fill the spacer void with a replacement first spacer 344 and a replacement second spacer 346. In this embodiment, the lower-k of the replacement first- and second spacers 344 and 346 is effective to reduce parasitic capacitance between the gate stack 318 and either or both of the first TCN 334 or the second TCN 336. The lower-k of the replacement first- and second spacers 344 and 346 is also effective to reduce parasitic capacitance between the gate stack 318 and either or both of the epitaxial layers 358 and 360. The lower-k of the replacement first- and second spacers 344 and 346 is also effective to reduce the fringing capacitance between the gate stack 118 and the tip doping regions 314 and 312, respectively.

Figure 3C:
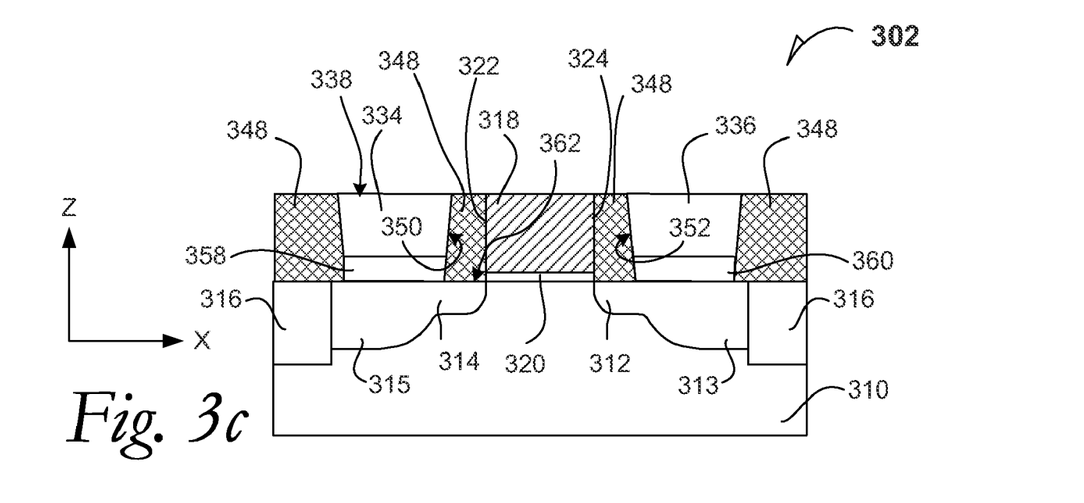
FIG. 3c is a cross-section elevation of the microelectronic device depicted in FIG. 3a after further processing according to an embodiment.

FIG. 3c is a cross-section elevation of the microelectronic device depicted in FIG. 3b after further processing according to an embodiment. An etch process or the like has been carried out to remove both the first- and second spacers 328 and 330 as well as the ILD 332. Thereafter, a fill process has been carried out such that a monolithic replacement spacer 348 has replaced both the ILD 332 and the first- and second spacers 328 and 330.

In this embodiment, the replacement spacer 348 exhibits a monolithic dielectric constant that results in a unique COV. In any event, the monolithic COV is less for the structure of the monolithic replacement spacer 348 than that of the ILD 332 and the first- and second spacers 328 and 330.

Also depicted is a first undercut 350 of the first TCN 334, a monolithic replacement spacer 344 at the first sidewall 322 of the gate stack 318, and a spacer recess 362. In this embodiment, the "monolithic replacement spacer" 344 means a single and uniform material occupies the region between the first sidewall 322, the first undercut 350, and the spacer recess 362.

Figure 1E:
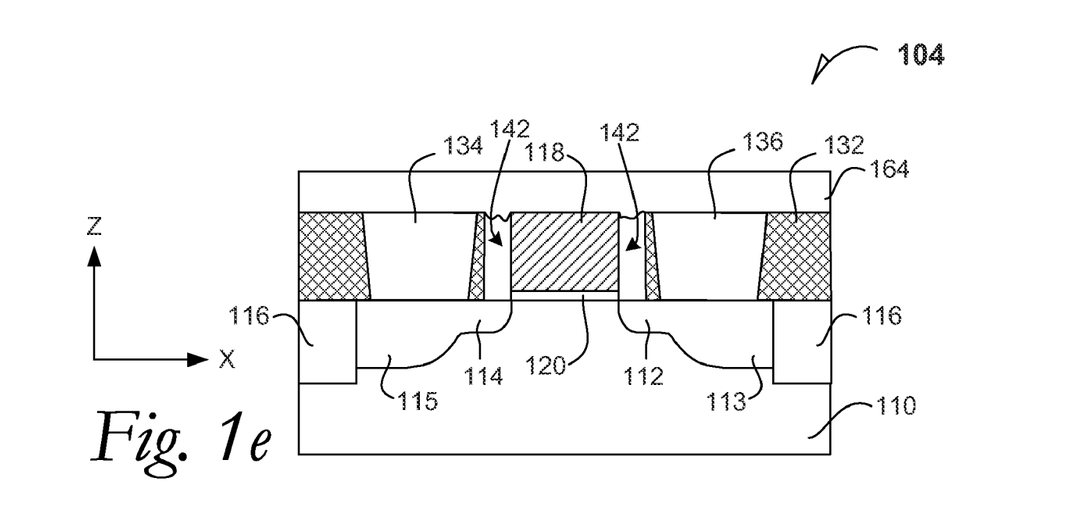
FIG. 1e is a cross-section elevation of the microelectronic device depicted in FIG. 1a after further processing according to an embodiment.

FIG. 1e is a cross-section elevation of the microelectronic device depicted in FIG. 1a after further processing according to an embodiment. The microelectronic device 104 has been processed such that the first spacer 128 and the second spacer 130 have been removed by an etch process to form a spacer void 142 that exposes the respective first sidewall 122 and second sidewall 124. In an embodiment, a gas is allowed to fill into the spacer void 142. In an embodiment, the gas is air. In an embodiment, the gas is an non-reactive gas such as nitrogen. In an embodiment, the gas is a non-reactive gas such as argon.

After allowing the gas to fill the spacer void 142, a cap layer 164 is formed over the upper surfaces in a manner that seals the spacer void 142 without substantially displacing the gas therein. Consequently, the spacer void 142 acts as a receptacle for the gas and a lower-k COV results compared to the COV that existed with the first spacer 128 and the second spacer 130. It can also be appreciated that the spacer void 142 may be expanded by removing all ILD 132 such that the cap layer 164 bridges between the first TCN 134, the gate stack 118, and the second TCN 136. This may be represented by applying a cap layer over the first TCN 134, the gate stack 118, and the second TCN 136 as depicted in FIG. 1d, but with no monolithic replacement spacer 148. Rather, a gas-filled void would be present.

Figure 2D:
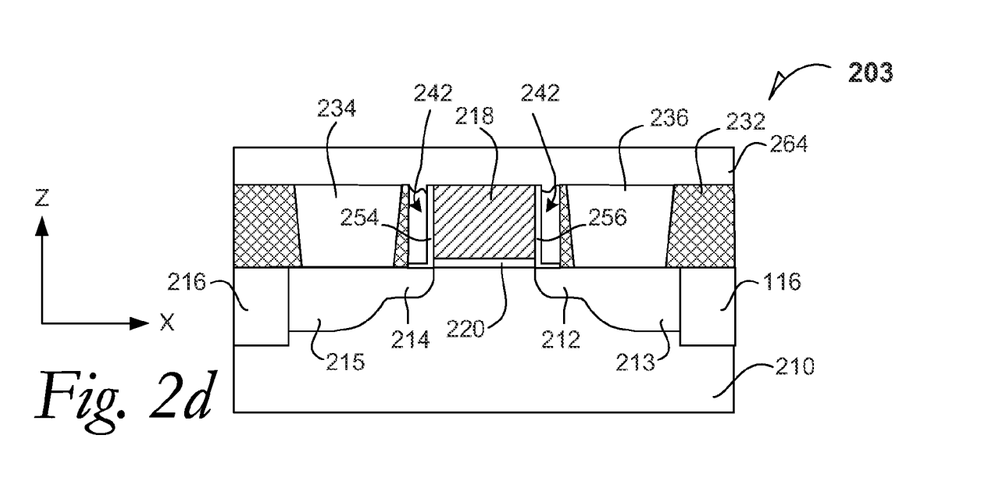
FIG. 2d is a cross-section elevation of the microelectronic device depicted in FIG. 2a after further processing according to an embodiment.

FIG. 2d is a cross-section elevation of the microelectronic device depicted in FIG. 2a after further processing according to an embodiment. The microelectronic device 203 has been processed such that the first spacer 228 and the second spacer 230 have been removed by an etch process to form a spacer void 242 that exposes the respective first permanent spacer 254 and second permanent spacer 256. In an embodiment, a gas is allowed to fill into the spacer void 242. In an embodiment, the gas is air. In an embodiment, the gas is an non-reactive gas such as nitrogen. In an embodiment, the gas is a non-reactive gas such as argon.

After allowing the gas to fill the spacer void 242, a cap layer 264 is formed over the upper surfaces in a manner that seals the spacer void 242 without substantially displacing the gas therein. Consequently, the spacer void 242 acts as a receptacle for the gas and a lower-k COV results compared to the COV that existed with the first spacer 228 and the second spacer 230. It can also be appreciated that the spacer void 242 may be expanded by removing all ILD 232 such that the cap layer 264 bridges between the first TCN 234, the first permanent spacer 254, the gate stack 218, the second permanent spacer 256, and the second TCN 236. It can also be appreciated that the spacer void 242 may be expanded by removing all ILD 232 such that the cap layer 264 bridges between the first TCN 234, the gate stack 218, and the second TCN 236. This may be represented by applying a cap layer over the first TCN 234, the gate stack 218, and the second TCN 236 as depicted in FIG. 2c, but with no monolithic replacement spacer 248. Rather, a gas-filled void would be present.

Figure 3D:
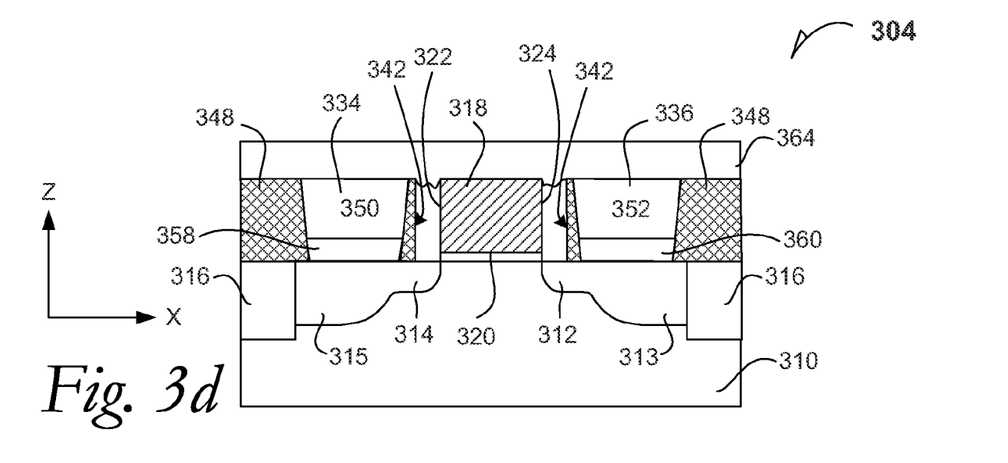
FIG. 3d is a cross-section elevation of the microelectronic device depicted in FIG. 3a after further processing according to an embodiment.

FIG. 3d is a cross-section elevation of the microelectronic device depicted in FIG. 3a after further processing according to an embodiment. The microelectronic device 300 also has an epitaxial first layer 358 and an epitaxial second layer 360 that are disposed above the respective source region 312, 313 and drain region 314, 315. The microelectronic device 304 has been processed such that the first spacer 328 and the second spacer 330 have been removed by an etch process to form a spacer void 342 that exposes the first sidewall 322 and the second sidewall 324. In an embodiment, a gas is allowed to fill into the spacer void 342. In an embodiment, the gas is air. In an embodiment, the gas is an non-reactive gas such as nitrogen. In an embodiment, the gas is a non-reactive gas such as argon.

After allowing the gas to fill the spacer void 342, a cap layer 364 is formed over the upper surfaces in a manner that seals the spacer void 342 without substantially displacing the gas therein. Consequently, the spacer void 342 acts as a receptacle for the gas and a lower-k COV results compared to the COV that existed with the first spacer 328 and the second spacer 330. It can also be appreciated that the spacer void 342 may be expanded by removing all ILD 332 such that the cap layer 364 bridges between the first TCN 334, the gate stack 318, and the second TCN 336. This may be represented by applying a cap layer over the first TCN 334, the gate stack 318, and the second TCN 336 as depicted in FIG. 3c, but with no monolithic replacement spacer 348. Rather, a gas-filled void would be present.

Figure 4:
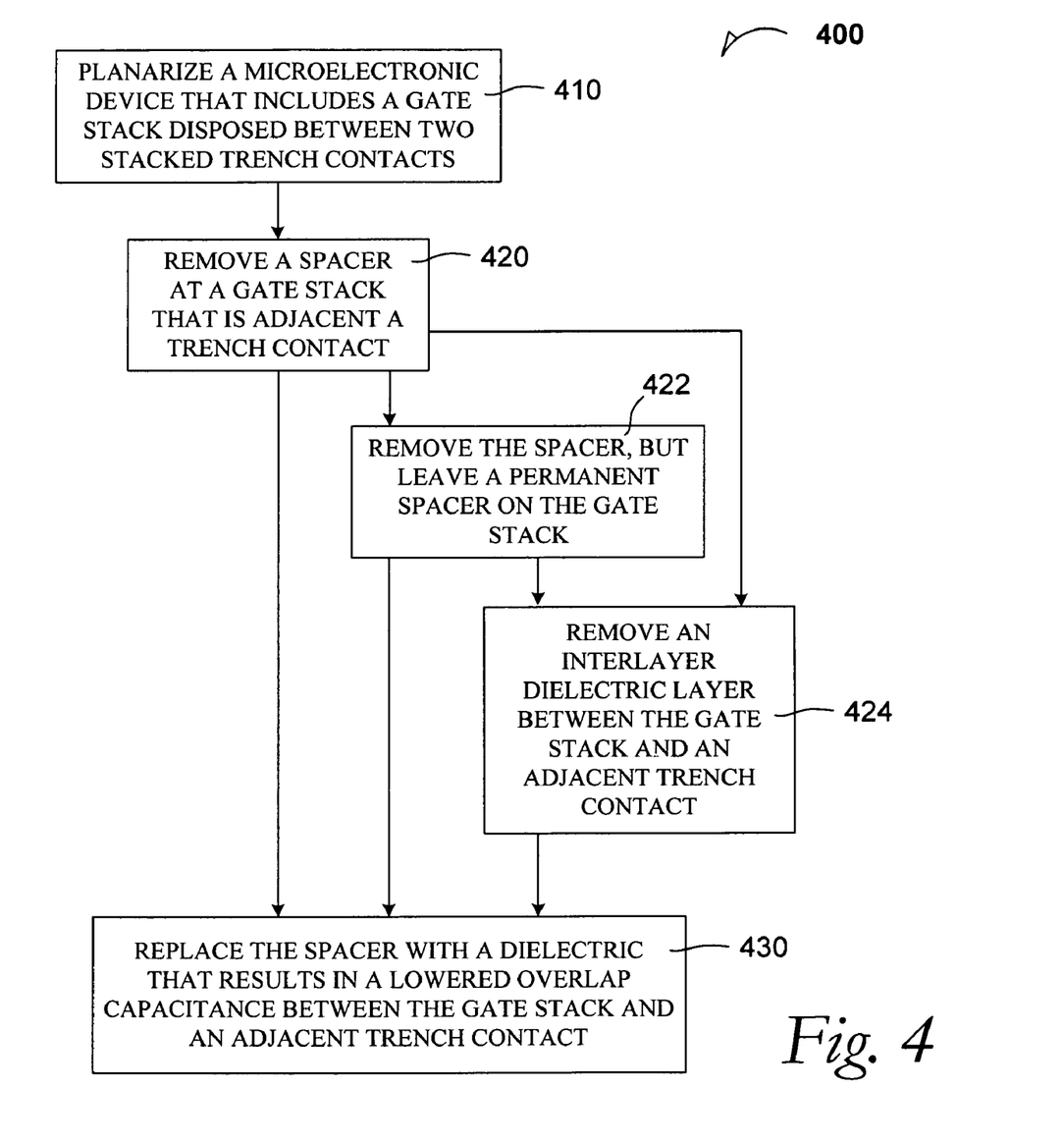
FIG. 4 is a process flow diagram according to an embodiment.

FIG. 4 is a process flow diagram 400 according to an embodiment.

At 410, the process includes planarizing a microelectronic device that includes a gate stack disposed between two stacked trench contacts. In an non-limiting example, the gate stack 118 depicted in the series 1 FIGs. is planarized along with the TCNs 134 and 136.

At 420, the process includes removing a spacer at a gate stack that is adjacent a trench contact. In a non-limiting example first side 122 and the second side 124 of the gate stack 118 are exposed by removing the spacers 128 and 130.

At 422, the process may include removing the spacer, but leaving a permanent spacer on the sidewalls of the gate stack.

In a non-limiting embodiment, the first- and second spacers 228 and 230, respectively, are removed, but the permanent spacers 254 and 256 are left on the sidewalls 222 and 224.

At 424, the process may include removing an interlayer dielectric layer between the gate stack and an adjacent stacked trench contact. In a non-limiting example, the ILD 132 is also removed as well as the first- and second spacers 128 and 130, respectively.

At 430, the process includes replacing the spacer with a dielectric that results in a lowered overlap capacitance between the gate stack and an adjacent stacked trench contact, between the gate stack and an adjacent epitaxial layer, and between the gate stack and adjacent tip doping regions. In a non-limiting example, the replacement spacer 144 is a material that can be filled below the planarized upper surfaces 140, 138, and 140 depicted in FIGS. 1a, 1xy, and 1xyz among others. In an example embodiment, the replacement spacer is a gas.

Figure 5:
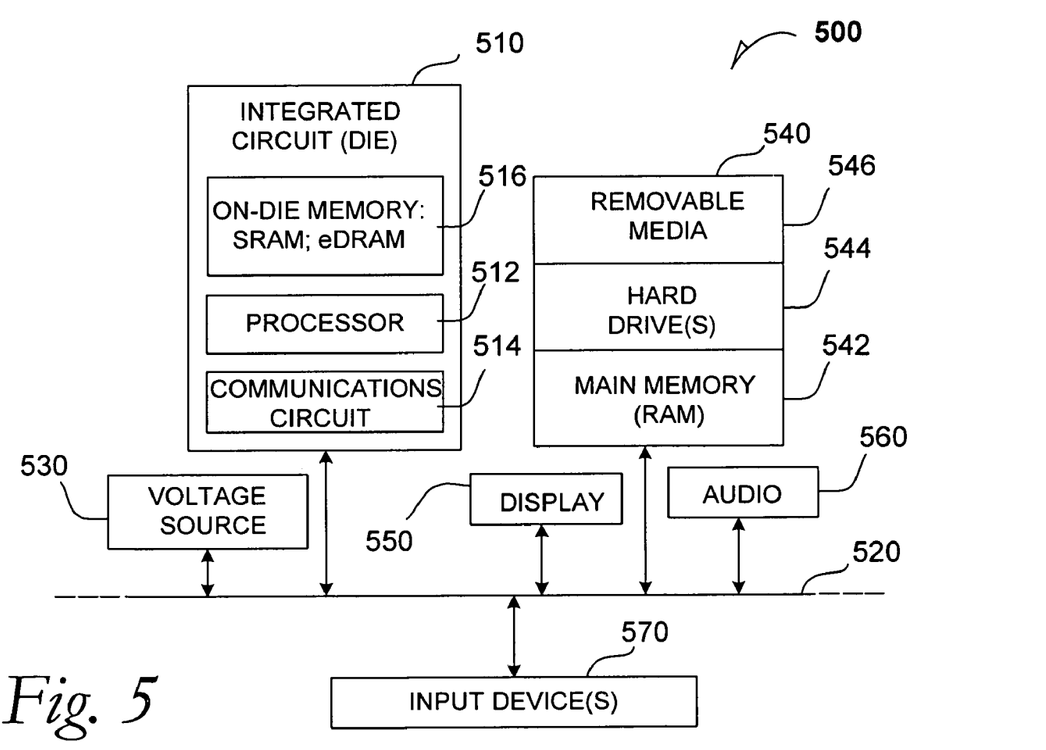
FIG. 5 is a schematic of an electronic system according to an embodiment.

FIG. 5 is a schematic of an electronic system 500 according to an embodiment. The electronic system 500 as depicted can embody a microelectronic device that has been planarized, the spacer removed, and a replacement spacer filled into the resulting void as set forth in this disclosure. In an embodiment, the electronic system 500 is a computer system that includes a system bus 520 to electrically couple the various components of the electronic system 500. The system bus 520 is a single bus or any combination of busses according to various embodiments. The electronic system 500 includes a voltage source 530 that provides power to the integrated circuit 510. In some embodiments, the voltage source 530 supplies current to the integrated circuit 510 through the system bus 520.

The integrated circuit 510 is electrically coupled to the system bus 520 and includes any circuit, or combination of circuits according to an embodiment. In an embodiment, the integrated circuit 510 includes a processor 512 that can be of any type. As used herein, the processor 512 may mean any type of circuit such as, but not limited to, a microprocessor, a microcontroller, a graphics processor, a digital signal processor, or another processor. Other types of circuits that can be included in the integrated circuit 510 are a custom circuit or an ASIC, such as a communications circuit 514 for use in wireless devices such as cellular telephones, pagers, portable computers, two-way radios, and similar electronic systems. In an embodiment, the processor 510 includes on-die memory 516 such as SRAM. In an embodiment, the processor 510 includes on-die memory 516 such as eDRAM.

In an embodiment, the electronic system 500 also includes an external memory 840 that in turn may include one or more memory elements suitable to the particular application, such as a main memory 542 in the form of RAM, one or more hard drives 544, and/or one or more drives that handle removable media 546, such as diskettes, compact disks (CDs), digital video disks (DVDs), flash memory keys, and other removable media known in the art.

In an embodiment, the electronic system 500 also includes a display device 550, an audio output 560. In an embodiment, the electronic system 500 includes a controller 570, such as a keyboard, mouse, trackball, game controller, microphone, voice-recognition device, or any other device that inputs information into the electronic system 500.

As shown herein, the integrated circuit 510 can be implemented in a number of different embodiments, including a microelectronic device that has been planarized, the spacer removed, and a replacement spacer filled into the resulting void, an electronic system, a computer system, one or more methods of fabricating an integrated circuit, and one or more methods of fabricating an electronic assembly that includes a microelectronic device that has been planarized, the spacer removed, and a replacement spacer filled into the resulting void as set forth herein in the various embodiments and their art-recognized equivalents. The elements, materials, geometries, dimensions, and sequence of operations can all be varied to suit particular chip-fabricating requirements.

The Abstract is provided to comply with 37 C.F.R. §1.72(b) requiring an abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. A process comprising:
   forming a gate stack above a semiconductive body, wherein the semiconductive body includes a source region doping, a shallow tip source doping, a drain region doping, and a shallow tip drain doping, the gate stack including a gate stack upper surface and first and second sidewalls;
   forming a first spacer at the first and second sidewalls;
   forming first and second stacked trench source and drain contacts respectively spaced apart and adjacent the first and second sidewalls;
   planarizing the gate stack and the first spacer and the first and second stacked trench source and drain contacts;
   after planarizing the gate stack and the first spacer and the first and second stacked trench source and drain contacts, removing the first spacer to leave a spacer void;
   filling the spacer void with a replacement spacer, wherein the replacement spacer has a different dielectric constant than the first spacer, and wherein capacitance between the gate stack and the stacked trench source and drain contacts, and between the gate stack and the tip doping, is lower than previously between the gate stack, the first spacer, and the adjacent stacked trench contacts and tip doping.

2. The process of claim 1, wherein removing the first spacer is carried out to leave a permanent spacer on the first and second sidewalls.

3. The process of claim 1, wherein the gate stack and the first and second stacked trench contacts are disposed in a first interlayer dielectric layer, wherein removing the first spacer also includes removing the first interlayer dielectric layer but leaving a permanent spacer on the first and second sidewalls.

4. The process of claim 1, wherein the gate stack and the first and second stacked trench contacts are disposed in a first interlayer dielectric layer, wherein removing the first spacer also includes removing the first interlayer dielectric layer but leaving a permanent spacer on the first and second sidewalls, wherein filling the spacer void with the replacement spacer includes:
   filling a gas into the spacer void; and
   forming a cap layer over the first and second stacked trench source and drain contacts and the gate stack.

5. The process of claim 1, wherein after filling the spacer void, capacitance between the gate stack and one of the first or second stacked trench contacts is reduced by 0.08 fF/µm or more compared to similar devices where the spacer material is not replaced.

6. The process of claim 1, wherein filling the spacer void with the replacement spacer includes:
   filling a gas into the spacer void; and
   forming a cap layer over the first and second stacked trench source and drain contacts and the gate stack.

7. The process of claim 1, wherein the gate stack and the first and second stacked trench contacts are disposed in a first interlayer dielectric layer, wherein removing the first spacer also includes removing the first interlayer dielectric layer.

8. The process of claim 1, wherein the gate stack and the first and second stacked trench contacts are disposed in a first interlayer dielectric layer, wherein removing the first spacer also includes removing the first interlayer dielectric layer, wherein filling the spacer void with the replacement spacer including:
   filling a gas into the spacer void; and
   forming a cap layer over the first and second stacked trench source and drain contacts and the gate stack.

9. The process of claim 1, wherein filling the spacer void with a replacement spacer results in a monolithic spacer disposed between an undercut of one of the trench contacts and an adjacent gate stack sidewall.

10. The process of claim 1, wherein forming the gate stack includes forming the gate stack upon a semiconductive prominence above a semiconductive substrate such that the gate stack contacts the semiconductive prominence on more than one surface.

11. A process comprising:
    forming a metal gate stack above a semiconductive body, including a metal gate stack upper surface and first and second sidewalls;
    forming a first spacer at the first and second sidewalls;
    forming first and second stacked trench source and drain contacts respectively spaced apart and adjacent the first and second sidewalls;
    planarizing the metal gate stack, the first spacer, and the first and second stacked trench source and drain contacts;
    after planarizing the metal gate stack, and the first spacer, and the first and second stacked trench source and drain contacts, removing the first spacer to leave a spacer void;
    filling the spacer void with a replacement spacer, wherein the replacement spacer has a different dielectric constant than the first spacer, and wherein capacitance between the gate stack and the stacked trench source and drain contacts is lower than previously between the gate stack, the first spacer, and the adjacent stacked trench contacts, and wherein overlap capacitance between the metal gate stack and one of the first or second stacked trench contacts is reduced by 0.08 fF/µm or more compared to similar devices where the spacer material is not replaced.

12. The process of claim 11, wherein removing the first spacer is carried out to leave a permanent spacer on the first and second sidewalls.

13. The process of claim 11, wherein filling the spacer void with a replacement spacer results in a monolithic spacer disposed between an undercut of one of the trench contacts and an adjacent gate stack sidewall.

14. The process of claim 11, wherein forming the gate stack includes forming the gate stack upon a semiconductive prominence above a semiconductive substrate such that the gate stack contacts the semiconductive prominence on more than one surface.

15. A process comprising:
   forming a gate stack above a semiconductive body, wherein the semiconductive body includes a source region doping, a shallow tip source doping, a drain region doping, and a shallow tip drain doping, the gate stack including a gate stack upper surface and first and second sidewalls;
   forming a first spacer at the first and second sidewalls;
   forming epitaxial first- and second layers to be disposed above the respective source region and drain region;
   forming first and second stacked trench source and drain contacts respectively spaced apart and adjacent the first and second sidewalls and upon the respective epitaxial first- and second layers;
   planarizing the gate stack and the first spacer and the first and second stacked trench source and drain contacts;
   after planarizing the gate stack and the first spacer and the first and second stacked trench source and drain contacts, removing the first spacer to leave a spacer void;
   filling the spacer void with a replacement spacer, wherein the replacement spacer has a different dielectric constant than the first spacer, and wherein capacitance between the gate stack and the stacked trench source and drain contacts, and between the gate stack and the tip doping, is lower than previously between the gate stack, the first spacer, and the adjacent stacked trench contacts and tip doping.

16. The process of claim 15, wherein filling the spacer void with the replacement spacer including:
   filling a gas into the spacer void; and
   forming a cap layer over the first and second stacked trench source and drain contacts and the gate stack.

17. The process of claim 15, wherein after filling the spacer void, capacitance between the gate stack and one of the first or second stacked trench contacts is reduced by 0.08 fF/$\mu$m or more compared to similar devices where the spacer material is not replaced.

18. The process of claim 15, wherein the gate stack and the first and second stacked trench contacts are disposed in a first interlayer dielectric layer, wherein removing the first spacer also includes removing the first interlayer dielectric layer.

19. The process of claim 15, wherein the gate stack and the first and second stacked trench contacts are disposed in a first interlayer dielectric layer, wherein removing the first spacer also includes removing the first interlayer dielectric layer, wherein filling the spacer void with the replacement spacer including:
   filling a gas into the spacer void; and
   forming a cap layer over the first and second stacked trench source and drain contacts and the gate stack.

20. The process of claim 15, wherein filling the spacer void with a replacement spacer results in a monolithic spacer disposed between an undercut of one of the trench contacts and an adjacent gate stack sidewall.

21. The process of claim 15, wherein forming the gate stack includes forming the gate stack upon a semiconductive prominence above a semiconductive substrate such that the gate stack contacts the semiconductive prominence on more than one surface.

\* \* \* \* \*